United States Patent
Gopalan et al.

(10) Patent No.: US 9,115,255 B2
(45) Date of Patent: Aug. 25, 2015

(54) CROSSLINKED RANDOM COPOLYMER FILMS FOR BLOCK COPOLYMER DOMAIN ORIENTATION

(71) Applicant: Wisconsin Alumni Research Foundation, Madison, WI (US)

(72) Inventors: Padma Gopalan, Madison, WI (US); Eungnak Han, Hillsboro, OR (US); Myungwoong Kim, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 70 days.

(21) Appl. No.: 13/828,803

(22) Filed: Mar. 14, 2013

(65) Prior Publication Data
US 2014/0263175 A1    Sep. 18, 2014

(51) Int. Cl.
| | |
|---|---|
| C03C 15/00 | (2006.01) |
| C03C 25/68 | (2006.01) |
| C23F 1/00 | (2006.01) |
| C08J 7/04 | (2006.01) |
| G03F 7/00 | (2006.01) |
| B41N 1/14 | (2006.01) |

(52) U.S. Cl.
CPC .............. *C08J 7/04* (2013.01); *G03F 7/0002* (2013.01); *B41N 1/14* (2013.01); *C08J 2325/08* (2013.01); *C08J 2453/00* (2013.01)

(58) Field of Classification Search
None
See application file for complete search history.

(56) References Cited

U.S. PATENT DOCUMENTS

| | | | |
|---|---|---|---|
| 7,521,090 B1 | 4/2009 | Cheng et al. | |
| 8,362,179 B2 | 1/2013 | Gopalan et al. | |
| 2001/0014420 A1 | 8/2001 | Takeuchi et al. | |
| 2009/0111703 A1 | 4/2009 | Gopalan | |
| 2009/0182093 A1* | 7/2009 | Cheng et al. | 525/88 |
| 2009/0236309 A1* | 9/2009 | Millward et al. | 216/39 |
| 2010/0311920 A1* | 12/2010 | Gonzalez et al. | 525/92 E |
| 2011/0201201 A1* | 8/2011 | Arnold et al. | 438/694 |
| 2014/0031478 A1* | 1/2014 | Lu et al. | 524/425 |

OTHER PUBLICATIONS

Somervell et al., Comparison of Directed Self-Assembly Integrations, Advances in Resist Materials and Processing Technology XXIX. Edited by Somervell, Mark H.; Wallow, Thomas I. Proceedings of the SPIE, vol. 8325, article id. 83250G, 14 pp. (2012).
Keen et al., Control of the Orientation of Symmetric Poly(styrene)-blockpoly(D,L.lactide) Block Copolymers Using Statistical Copolymers of Dissimilar Composition, Langmuir, vol. 28, Oct. 22, 2012, pp. 15876-15888.

(Continued)

*Primary Examiner* — Allan Olsen
*Assistant Examiner* — Margaret D Klunk
(74) *Attorney, Agent, or Firm* — Bell & Manning, LLC

(57) ABSTRACT

Surface-modifying layers, including neutral layers for vertical domain-forming block copolymers of styrene and methyl methacrylate are provided. Also provided are self-assembled block copolymer structures incorporating the surface modifying layers, methods of fabricating such structures and methods of using the structures in BCP lithography applications. The surface-modifying layers comprise a crosslinked copolymer film, wherein the crosslinked copolymers are random copolymers polymerized from styrene monomers and/or (meth)acrylate monomers and crosslinkable epoxy group-functionalized monomers. The crosslinked copolymer films are characterized by a high content of the crosslinkable epoxy group-functionalized monomer.

21 Claims, 3 Drawing Sheets

(56) References Cited

OTHER PUBLICATIONS

Liu et al., Fabrication of Lithographically Defined Chemically Patterned Polymer Brushes and Mats, Macromolecules, vol. 44, Mar. 18, 2011, pp. 1876-1885.

Liu et al., Integration of block copolymer directed assembly with 193 immersion lithography, J. Vac. Sci. Technol. B, vol. 28, No. 6, Nov. 30, 2010, pp. C6B30-C6B34.

In et al., Side-Chain-Grafted Random Copolymer Brushes as Neutral Surfaces for Controlling the Orientation of Block Copolymer Microdomains in Thin Films, Langmuir, vol. 22, No. 18, Aug. 1, 2006, pp. 7855-7860.

Han et al., Effect of Composition of Substrate-Modifying Random Copolymers on the Orientation of Symmetric and Asymmetric Diblock Copolymer Domains, Macromolecules, vol. 41, Nov. 6, 2008, pp. 9090-9097.

Han et al., Cross-Linked Random Copolymer Mats As Ultrathin Nonpreferential Layers for Block Copolymer Self-Assembly, Langmuir, vol. 26, Sep. 30, 2009, pp. 1311-1315.

Han et al., Photopatternable Imaging Layers for Controlling Block Copolymer Microdomain Orientation, Adv. Mat., vol. 19, 2007, pp. 4448-4452.

Han et al., Perpendicular Orientation of Domains in Cylinder-Forming Block Copolymer Thick Films by Controlled Interfacial Interactions, Macromolecules, vol. 42, Jun. 11, 2009, pp. 4896-4901.

\* cited by examiner

GA

GMA

CROSSLINKED RANDOM COPOLYMER FILMS FOR BLOCK COPOLYMER DOMAIN ORIENTATION

REFERENCE TO GOVERNMENT RIGHTS

This invention was made with government support under 0832760 awarded by the National Science Foundation. The government has certain rights in the invention.

BACKGROUND

Block copolymer (BCP) lithography has emerged as a promising tool to create highly regular and dense dot or line arrays at sub 50 nm length scales. Block copolymer lithography refers to the use of self-assembled domain structures, typically spheres, cylinders, and lamellas in the form of a thin film as a template for addition and subtraction nanofabrication processes. Two pattern geometries have been the focus of BCP studies: dense arrays of dots; and dense arrays of lines and spaces. The former can be generated from sphere-forming BCPs or from cylinder-forming BCPs with domains oriented perpendicular (vertical) with respect to the substrate surface, and the latter from cylinder-forming BCPs with domains oriented parallel with respect to the substrate surface or lamella-forming BCPs with domains oriented vertically with respect to the substrate surface. However, lamellae and cylinders that are oriented perpendicular (vertical) with respect to the underlying substrate surface may have advantages in pattern transfer applications over spheres or parallel cylinders because of the higher aspect ratio of the resulting template and the vertical side-walls.

The perpendicular alignment of block copolymer domains in thin films can be controlled by chemical modification of the substrate in the form of neutral layers that are used to induce perpendicular domain orientation. Crosslinked or grafted films of random terpolymers have been used as neutral layers for block copolymers of styrene and methyl methacrylate (e.g., P(S-b-MMA)). For example, terpolymers of styrene, methyl methacrylate and a third crosslinkable co-monomer, such as hydroxyl methacrylate (HEMA) or glycidyl methacrylate (GMA), have been used as neutral (nonpreferential) surfaces for the formation of vertical domains in an overlying block copolymer. However, in the design of these terpolymer-based neutral layers, adjusting the interfacial energy between the neutral layer surface and the P(S-b-MMA) was accomplished by changing the amount of styrene and MMA in the random copolymer. The amount of the crosslinkable third monomer (e.g., GMA) was fixed at a low level, since this monomer was used to provide crosslinking and not to control wetting properties.

SUMMARY

Surface-modifying layers for domain-forming block copolymers are provided. Also provided are self-assembled block copolymer structures incorporating the surface-modifying layers, methods of fabricating such structures and methods of using the structures in BCP lithography applications.

One embodiment of a method of forming a self-assembled block copolymer film comprises the steps of: (a) forming a crosslinked copolymer film on a substrate surface, the crosslinked copolymer film comprising crosslinked random copolymer chains, wherein the random copolymer chains comprise styrene monomers copolymerized with crosslinkable epoxy group-functionalized monomers and, optionally, one or more additional monomers, wherein the epoxy group-functionalized monomers are acrylate monomers, methacrylate monomers or styrenic monomers and further wherein the epoxy groups are linked to the monomers by a non-cyclic linking group; the random copolymer chains comprising at least 5% of the epoxy group-functionalized monomers and no greater than 5% of the additional monomers; (b) depositing a block copolymer over the crosslinked copolymer film, wherein the block copolymer comprises copolymerized styrene monomers and further wherein the crosslinked copolymer film provides a neutral layer for the self-assembly of the block copolymer into vertical domains; and (c) subjecting the block copolymer to conditions that induce the block copolymer to self-assemble into vertical domains.

Another embodiment of a method of forming a self-assembled block copolymer film comprises the steps of: (a) forming a crosslinked copolymer film on a substrate surface, the crosslinked copolymer film comprising crosslinked random copolymer chains, wherein the random copolymer chains comprise methyl methacrylate monomers copolymerized with crosslinkable epoxy group-functionalized monomers and, optionally, one or more additional monomers; the random copolymer chains comprising at least 4% of the epoxy group-functionalized monomers and no greater than 5% of the additional monomers; (b) depositing a block copolymer over the crosslinked copolymer film, wherein the block copolymer comprises copolymerized styrene monomers and vinylpyridine monomers and further wherein the crosslinked copolymer film provides a surface-modifying layer for the self-assembly of the block copolymer into a patterned domains; and (c) subjecting the block copolymer to conditions that induce the block copolymer to self-assemble into patterned domains.

The structures in which the surface-modifying layers provide neutral layers for vertical domain formation can be used in BCP lithography applications by selectively removing one or more of the block copolymer domains, such that a mask pattern is formed over the substrate and then transferring the mask pattern to the substrate.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

DETAILED DESCRIPTION

Figure 1:
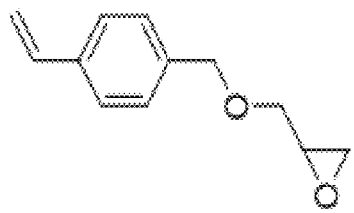
FIG. 1 shows the structures of glycidyl methacrylate, glycidyl acrylate and two styrene monomers having epoxy-group functionalized aromatic rings.
Figure 1:
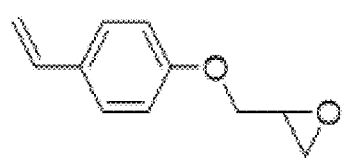
Figure 1:
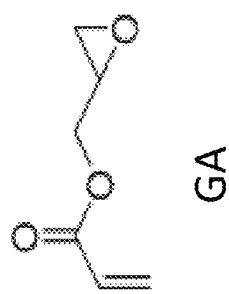
Figure 1:
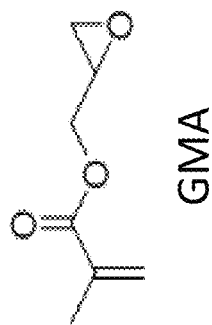

Surface-modifying layers, including neutral layers for vertical domain-forming block copolymers of styrene and methyl methacrylate are provided. Also provided are self-assembled block copolymer structures incorporating the surface modifying layers, methods of fabricating such structures and methods of using the structures in BCP lithography applications. The surface-modifying layers comprise a crosslinked copolymer film, wherein the crosslinked copolymers are random copolymers polymerized from styrene monomers and/or (meth)acrylate monomers and crosslinkable epoxy group-functionalized monomers. The crosslinked copolymer films are characterized by a high content of the crosslinkable epoxy group-functionalized monomer. Despite the high level of epoxy-functional monomer in the random copolymer chains, the films are able to provide robust and stable films, yet are still able to act as neutral layers for vertical domain formation in various styrene-containing block copolymers. (Acrylate and methacrylate monomers are referred to collectively as (meth)acrylate monomers.)

In the random copolymers, the monomer ratios are selected to provide a surface-modifying layer that acts as a preferential layer or a neutral layer for the phase-segregation of an overlying domain-forming block copolymer. As used herein, the term neutral layer refers to a layer that does not exhibit preferential wetting behavior—or that exhibits only a very weak preferential wetting behavior—toward a polymer block in an overlying domain-forming block copolymer, such that it provides for the induction of vertical domain formation in the block copolymer. The present surface-modifying layer platforms offer several advantages relative to other platforms. First, surface-modifying layers of the present crosslinked random copolymer films, which can be polymerized from widely available and inexpensive monomers, make it possible to fabricate self-assembled block copolymer films on a wider range of substrates and, in some instances, eliminate the need for a wetting layer between the underlying substrate and the surface-modifying layer. In addition, the crosslinking of the copolymer film can be carried out at low temperatures (e.g., ≤150° C.) which provides an even greater degree of flexibility in the selection of substrates.

Notably, in the random copolymers of the present crosslinked films, the crosslinkable epoxy-functional monomer is not merely included in the copolymer in small quantities to provide a minimum, sufficient crosslinking density—with the wetting behavior being controlled primarily by the inclusion of significant quantities of a third monomer. Instead, the epoxy-functional monomer content in the random copolymer plays a key role in controlling the wetting properties of the crosslinked copolymer film. As a result, the present random copolymers have a significantly higher concentration of crosslinkable epoxy-functional monomer than other crosslinkable, epoxy-functional random copolymers that are currently used as neutral layer materials for domain-forming block copolymers. For example, various embodiments of the random copolymers have an epoxy group-functionalized monomer content of at least 5%. This includes random copolymers having epoxy group-functionalized monomer contents of at least 10%, at least 15%, at least 35% and at least 50%. (Unless otherwise indicated, the percentages recited refer to mol. %). Despite the high level of epoxy-functional monomer in the random copolymer chains, the films are able to provide robust and stable films, yet are still able to act as neutral layers for vertical domain formation in various styrene-containing block copolymers. Illustrative ranges into which the epoxy group-functionalized monomer content can fall include from about 4% to about 50% and from about 10% to about 35%.

The crosslinkable epoxy groups may be thermally crosslinkable epoxy groups or photocrosslinkable epoxy groups. The epoxy group-functionalized monomers can be acrylate monomers, methacrylate monomers or styrenic monomers. In some embodiments, the epoxy groups are linked to the monomers by a non-cyclic linking group. That is—they are not epoxy-group containing cycloaliphatic groups. Glycidyl methacrylate (GMA) and glycidyl acrylate (GA) are examples of suitable crosslinkable epoxy-group-functionalized monomers. The structures of these monomers, as well as two styrenic monomers functionalized with crosslinkable epoxy groups, are shown in FIG. 1.

In some embodiments, the crosslinked films are designed to provide neutral layers for the induction of vertical domain formation in block copolymers, such as block copolymers of styrene and methyl methacrylate (P(S-b-MMA)). In some such embodiments, the copolymer chains of the random copolymers consist of (or consist essentially of) only crosslinkable epoxy-group-functionalized monomers and styrene monomers. However, small amounts of one or more additional monomers may be included in the random copolymers to provide the desired wetting properties. Generally, the content of such additional monomers in the random copolymers will be no greater than about 5%. This includes embodiments in which the content of such additional monomers is no greater than about 3% and further includes embodiments in which the content of such additional monomers is no greater than about 1%.

The ratio of the styrene to crosslinkable epoxy group-containing monomer can be tailored based on the desired vertical domain morphology of the polystyrene-polymethyl methacrylate block copolymer and on the monomer content of the block copolymer. In some embodiments, the block copolymer is polymerized from styrene and methyl methacrylate co-monomers only. While in other embodiments, additional monomers may be included in the block copolymer. By way of illustration, a diblock copolymer of styrene and methyl methacrylate, P(S-b-MMA), which forms vertically oriented, hexagonally-packed cylindrical domains can be used, wherein the number average molecular weight of the polystyrene in the block copolymer is in the range from about 15 kg/mol to about 100 kg/mol, while the number average molecular weight of the polymethyl methacrylate is in the range from about 10 kg/mol to about 45 kg/mol. The crosslinkable epoxy group-functionalized monomer content in the random copolymer of the neutral layer for these cylinder-forming block copolymers is typically in the range from about 10% to about 15%. Alternatively, a block copolymer of styrene and methylmethacrylate, P(S-b-MMA) which forms vertically oriented, lamellar domains can be used, wherein the number average molecular weight of the polystyrene in the block copolymer is in the range from about 14 kg/mol to about 500 kg/mol, while the number average molecular weight of the polymethyl methacrylate is in the range from about 14 kg/mol to about 500 kg/mol. The crosslinkable epoxy group-functionalized monomer content in the random copolymer of the neutral layer for these lamellae-forming block copolymers is typically in the range from about 15% to about 20%.

In addition to providing neutral layers for P(S-b-MMA) block copolymers, the random copolymers polymerized from styrene and crosslinkable epoxy group-functionalized monomers can provide surface-modifying layers (including both preferential layers (e.g., preferentially wet by styrene) and neutral layers) for other styrene-based block copolymers, such as block copolymers of styrene and 2-vinylpyridine (P(S-b-2VP)) and block copolymers of styrene and D,L-lactide (P(S-b-PLA)). For example, a neutral layer for a P(S-b-2VP) diblock copolymer could be provided by a random copolymer comprising from about 50 to about 70% styrene and from about 30 to 50% GMA. A neutral layer for a P(S-b-PLA) diblock copolymer (e.g., (Mn(PS): 3 kg/mol~100 kg/mol, Mn(PLA): 3 kg/mol~100 kg/mol)) could be provided by a random copolymer comprising from about 70 to about 85% styrene and from about 15 to about 30% GMA. The styrene content for random copolymers that provide styrene-preferential layers will be substantially higher. (e.g., About 95 to about 99% styrene and about 1 to about 5% GMA).

In other embodiments of the crosslinked films that are designed to provide preferential or neutral layers for P(S-b-2VP), the random copolymers are polymerized entirely or primarily from methyl methacrylate monomers and crosslinkable epoxy group-functionalized monomers—such as GMA. In some such embodiments, the copolymer chains of the random copolymers consist of (or consist essentially of) only crosslinkable epoxy-group-functionalized monomers and methyl methacrylate monomers. However, small amounts of one or more additional monomers may be included in the random copolymers to provide the desired wetting properties. Generally, the content of such additional monomers in the random copolymers will be no greater than about 5%. This includes embodiments in which the content of such additional monomers is no greater than about 3% and further includes embodiments in which the content of such additional monomers is no greater than about 1%.

The ratio of the methyl methacrylate to crosslinkable epoxy group-containing monomer can be tailored based on the desired vertical domain morphology of the P(S-b-2VP) block copolymer and on the monomer content of the block copolymer. In some embodiments, the block copolymer is polymerized from styrene and vinylpyridine co-monomers only. While in other embodiments, additional monomers may be included in the block copolymer. By way of illustration, a P(S-b-2VP) block copolymer that forms vertically oriented, lamellar domains can be used, wherein the number average molecular weight of the polystyrene in the block copolymer is in the range from about 4 kg/mol to about 50 kg/mol, while the number average molecular weight of the polyvinylpyridine is in the range from about 4 kg/mol to about 50 kg/mol. The crosslinkable epoxy group-functionalized monomer content in the random copolymer of the neutral layer for these lamellae-forming block copolymers is typically in the range from about 30% to about 50%.

The random copolymers can be crosslinked into a polymeric film by coating a solution comprising the random copolymers onto a substrate surface and then applying heat and/or light to the coating in induce crosslinks to form between the epoxy groups on the random copolymer chains. By synthesizing the random copolymers before crosslinking them, problems related to blend immiscibility can be avoided, ensuring the fabrication of a highly homogeneous single-component polymer film.

Enough of the random copolymer solution should be deposited onto the substrate surface to achieve a desired thickness for the crosslinked film. The thickness of the crosslinked random copolymer film is desirably selected such that the chemical composition, rather than the film thickness, controls the orientation of the domains in the overlying block copolymer. For example, in some embodiments, the crosslinked random copolymer films have a thickness in the range from about 2 nm to about 20 nm. This includes embodiments of the films having a thickness in the range from about 2 nm to about 10 nm and further includes embodiments of the films having a thickness in the range from about 2 nm to about 8 nm. However, thicknesses outside of these ranges may also be used. Generally, very thin films (e.g., those having a thickness of about 6 nm or less) will benefit from a higher crosslinking density in order to improve their stability against delamination from the surface of the underlying substrate.

The films can be crosslinked on a variety of substrates and do not need to form covalent bonds with the substrates to achieve stability against delamination. Thus, although covalent bonds may be formed between the random copolymers and the underlying substrate in some instances (as in the case where the substrate comprises an oxide), in some embodiments there is no covalent bonding between the crosslinked films and the underlying substrate. Graphene (single-layer or multi-layered) is one example of a substrate on which the crosslinked random copolymer films can be formed. Other examples of substrate materials on which the crosslinked films may be formed include silicon, silicon dioxide, metals, metal oxides, semiconductor oxides and ceramics. The substrate surfaces upon which the films are formed may be planar or non-planar surfaces.

Once the crosslinked random copolymer films have been formed, a layer of domain-forming block copolymer can be deposited over the film using a coating technique such as spin-coating. The block copolymer can then be subjected to conditions that induce the formation of a pattern of domains in the block copolymer film due to phase segregation. If the crosslinked film provides a neutral layer, the domains will have a vertical orientation with respect to the substrate surface. By "vertical" or "perpendicular" it is meant that the molecular structures within the domains form an approximate, but not necessarily exact, right angle with the surface of the substrate.

The step of subjecting the block copolymer to conditions that induce it to undergo domain formation include subjecting the block copolymer to a thermal anneal for a time sufficient to allow the block copolymer to self-assemble into domains or subjecting the block copolymer to a solvent anneal. During a solvent anneal, the block copolymer film undergoes swelling as it is exposed to a saturated solvent vapor atmosphere, typically at room temperature (23° C.), for a time sufficient to allow the block copolymer to self-assemble into domains.

Figure 2:
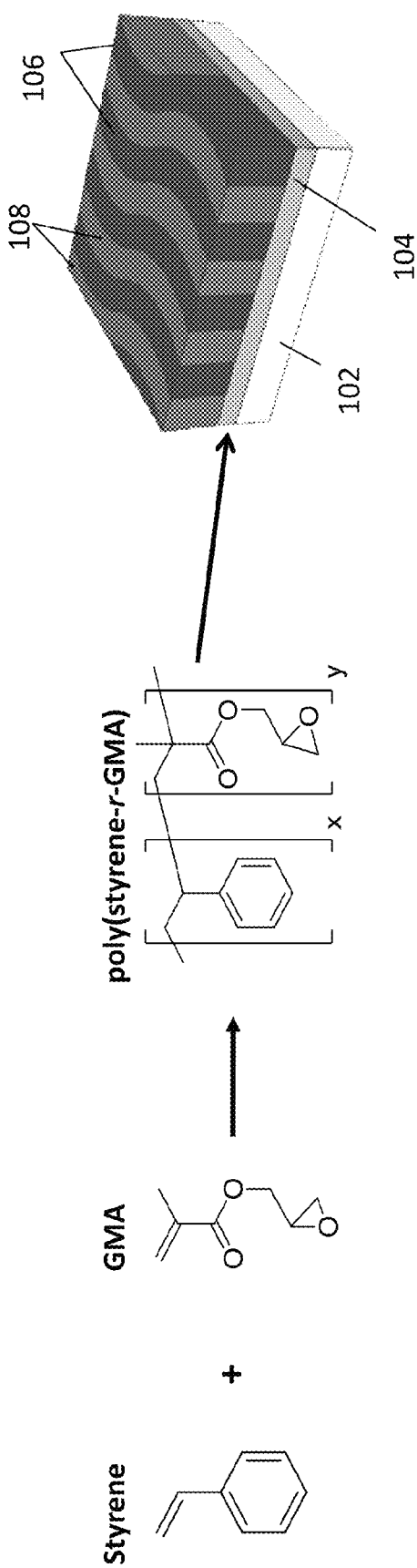
FIG. 2 is a schematic diagram illustrating the use a polymeric film composed of crosslinked random copolymer chains consisting of styrene and glycidyl methacrylate comonomers as a neutral layer for a lamellae-forming block copolymer film.

FIG. 2 is a schematic diagram illustrating the synthesis and use of a neutral layer composed of crosslinked random copolymer chains for vertical domain formation in a lamellae-forming block copolymer film. The random copolymer in this example is polymerized from styrene and GMA co-monomers (where the x and y in the structure represent the mole ratios of monomers in the copolymer) and is designated poly(styrene-r-GMA). Once formed, the random copolymers are deposited onto the surface of a substrate 102 and crosslinked into a film 104 that provides a neutral layer for a poly(styrene-b-methyl methacrylate) block copolymer layer that phase segregates into lamellar domains, comprising polystyrene lamellae 106 interspersed with polymethyl methacrylate lamellae 108.

After the self-assembled block copolymer layer has been formed, it can be converted into an etch mask by selectively removing (e.g., etching) one or more of the domains from the block copolymer layer. The resulting mask pattern can then be transferred to the underlying substrate. This pattern transfer can be carried out by additive or subtractive processes and, once the pattern transfer is complete, the remaining block copolymer layer and neutral layer can be removed. For example, the pattern can be transfer to the underlying substrate by selectively chemically modifying regions of the substrate surface that are exposed through the mask by chemical functionalization; by selectively removing (e.g., etching) regions of the substrate that are exposed through the mask; or by selectively coating (e.g., by material growth or deposition) regions of the substrate that are exposed through the mask.

In the embodiment depicted in FIG. 2, the lamellae comprising the PMMA blocks can be selectively removed using, for example, an $O_2$ plasma reactive ion etch, leaving the lamellae comprising the PS blocks in a striped pattern. The stripes in said pattern may be substantially linear or may form a fingerprint pattern, depending on the morphology of the block copolymer domains. Once the stripe pattern is formed by the block copolymer layer, it can be used as an etch mask for transferring the pattern into the underlying substrate. For example, if the underlying substrate is graphene the stripe pattern can be transferred into the graphene to provide a graphene nanoribbon array. The graphene nanoribbon array is characterized by a stripe pattern that corresponds closely, if not exactly, to the pattern in the block copolymer layer. Thus, the graphene nanoribbon array comprises a plurality of aligned, parallel strips ("nanoribbons") of graphene, wherein neighboring strips are spatially separated by a gap.

Although mask formation is illustrated using lamellar block copolymer domains in FIG. 2, other patterns are possible. For example, cylindrical block copolymer domains can be used to provide a nanoporous mask that defines a pattern of holes with a hexagonal packing arrangement. The hole pattern can then be transferred into the underlying substrate to form a nanoperforated substrate, such as a nanoperforated graphene sheet.

Because the domains in the block copolymer can be formed with nanoscale dimensions (e.g., with dimensions, such as cylinder diameters or lamellae thicknesses, of ≤1000 nm, ≤100 nm or ≤10 nm) the features of the pattern transferred into the underlying substrate can have correspondingly small dimensions (e.g., hole diameters or stripe widths).

EXAMPLES

Example 1

This example describes a method of forming a crosslinked copolymer film composed of a random copolymer of styrene and glycidyl methacrylate (P(S-r-GMA)) and a method of using the crosslinked random copolymer film as a neutral layer for vertical domain formation in P(S-b-MMA) block copolymers.

Experimental Section

Materials.

Styrene and glycidyl methacrylate (GMA) were purchased from Aldrich and distilled under reduced pressure. 2,2,5,5-Tetramethyl-3-(1-phenylethoxy)-4-phenyl-3-azahexane (NMP initiator) was synthesized following the literature. (Benoit, D.; Chaplinski, V.; Braslau, R.; Hawker, C. J. *J. Am. Chem. Soc.* 1999, 121, 3904-3920.) Two BCPs were purchased from Polymer Source, Inc. (Dorval, Quebec, Canada) and used without further purification: symmetric P(S-b-MMA) (PS 52 kg/mol, PMMA 52 kg/mol, polydispersity index (PDI), 1.09), asymmetric PMMA cylinder forming P(S-b-MMA) (PS 50.5 kg/mol, PMMA 20.9 kg/mol, PDI, 1.06).

Synthesis of P(S-r-GMA) Via Free Radical Polymerization.

A series of P(S-r-GMA) was synthesized via free radical polymerization with varied feed ratio of styrene (0.85~0.50) and varied feed ratio (0.15~0.50) of GMA, following a procedure reported earlier. (Han, E.; Gopalan, P. *Langmuir* 2010, 26, 1311-1315.) For typical example, the mixture of styrene (8.16 g, 78.34 mmol), GMA (1.97 g, 13.83 mmol), AIBN (0.10 g, 0.61 mmol), and toluene (10 ml) was degassed via three freeze-pump-thaw cycles and placed in an oil bath at 80° C. for 24 hours. The resultant was then diluted with THF and precipitated into methanol. The polymer was collected as a white powder and dried under vacuum.

Synthesis of P(S-r-GMA) Via Nitroxide Mediated Polymerization.

P(S-r-GMA) was synthesized via nitroxide mediated polymerization with the styrene feed ratio of 0.96 and the GMA feed ratio of 0.04, following a procedure reported earlier. (Han, E.; Stuen, K. O.; La, Y.-H.; Nealey, P. F.; Gopalan, P. *Macromolecules* 2008, 41, 9090-9097.) The mixture of GMA (0.14 g, 1.00 mmol), styrene (2.50 g, 23.96 mmol), and NMP initiator (20 mg, 0.061 mmol) was degassed via three freeze-pump-thaw cycles and placed in an oil bath at 120° C. for 36 hours. The resultant was then diluted with THF and precipitated into methanol. The polymer was collected as a white powder and dried under vacuum.

Substrate Preparation and Thin Film Formation.

Figure 3:
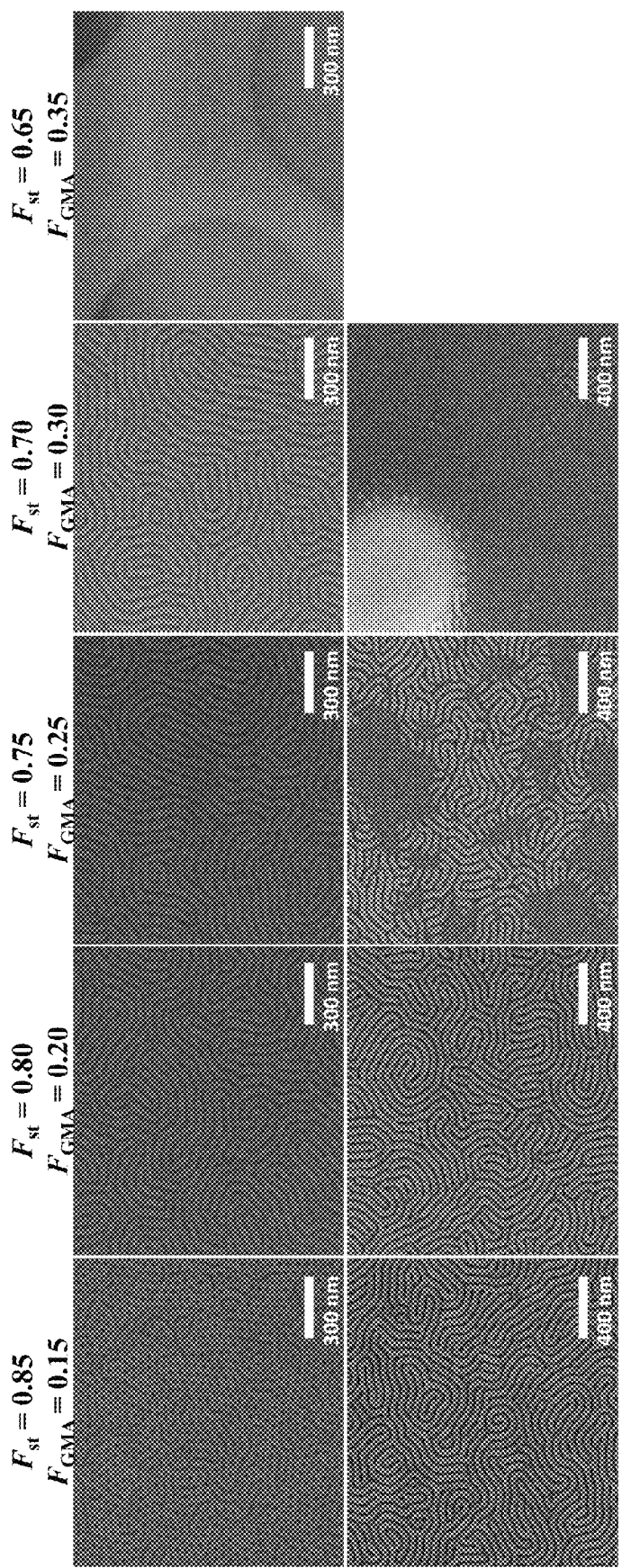
FIG. 3 are SEM images showing domain formation in cylinder-forming (top panels) and lamellae-forming (bottom panels) diblock copolymers of styrene and methyl methacrylate P(S-b-MMA) on neutral layers comprising crosslinked random copolymers of styrene and glycidyl methacrylate.

A solution of P(S-r-GMA) (0.3% w/w) in toluene was spin-coated onto silicon wafers that had been cleaned using piranha acid (7:3 $H_2SO_4$:$H_2O_2$, caution: reacts violently with organic compounds). The substrate was then annealed under vacuum at 220° C. for 5 min. After annealing, the substrate was soaked in toluene and rinsed copiously with fresh toluene to remove uncross-linked polymer, resulting in 5~11 nm thick cross-linked thin film. On these cross-linked films, a solution of symmetric P(S-b-MMA) (PS 52 kg/mol, PMMA 52 kg/mol, polydispersity index (PDI), 1.09) or asymmetric PMMA cylinder forming P(S-b-MMA) (PS 50.5 kg/mol, PMMA 20.9 kg/mol, PDI, 1.06) (1.0 wt % or 1.5 wt %) was spin-coated at 4000 rpm. All BCP films were annealed at 220° C. for 10 min under vacuum to drive self-assembly of block copolymer domains. Top-down scanning electron microscope (SEM) images of the BCP microdomains were acquired using a LEO-1550VP field-emission instrument using an accelerating voltage of 1 kV. These images are shown in FIG. 3.

Example 2

This example describes a method of forming a random copolymer of methyl methacrylate and glycidyl methacrylate (P(MMA-r-GMA)) suitable for use as a surface-modifying layer for domain formation in P(S-b-2VP) block copolymers.

Materials.

Methyl methacrylate and GMA were purchased from Aldrich and distilled under reduced pressure. BCPs were purchased from Polymer Source, Inc. (Dorval, Quebec, Canada) and used without further purification.

Synthesis of P(MMA-r-GMA).

A series of P(MMA-r-GMA) was synthesized via free radical polymerization with varied feed ratio of styrene (0.96~0.92) and varied feed ratio (0.04~0.08) of GMA, following a procedure reported earlier. (Han, E.; Gopalan, P. *Langmuir* 2010, 26, 1311-1315.) For typical example, the mixture of MMA (5.00 g, 49.94 mmol), GMA (0.28 g, 1.97 mmol), AIBN (0.10 g, 0.61 mmol), and toluene (6 ml) was degassed via three freeze-pump-thaw cycles and placed in an oil bath at 80° C. for 24 hours. The resultant was then diluted with THF and precipitated into hexane. The polymer was collected as a white powder and dried under vacuum.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more". Still further, the use of "and" or "or" is intended to include "and/or" unless specifically indicated otherwise.

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A method of forming a self-assembled block copolymer film, the method comprising:
    forming a crosslinked copolymer film on a substrate surface, the crosslinked copolymer film comprising crosslinked random copolymer chains, wherein the random copolymer chains comprise styrene monomers copolymerized with crosslinkable epoxy group-functionalized monomers and, optionally, one or more additional monomers, wherein the epoxy group-functionalized monomers are acrylate monomers, methacrylate monomers or styrenic monomers and further wherein the epoxy groups are not part of an epoxy group-containing cycloaliphatic group; the random copolymer chains comprising at least 5 mol. % of the epoxy group-functionalized monomers and no greater than 5 mol. % of the additional monomers;
    depositing a block copolymer over the crosslinked copolymer film, wherein the block copolymer comprises copolymerized styrene monomers and further wherein the crosslinked copolymer film provides a neutral layer for the self-assembly of the block copolymer into vertical domains; and
    subjecting the block copolymer to conditions that induce the block copolymer to self-assemble into vertical domains.

2. The method of claim 1, wherein the random copolymer chains comprise at least 10% of the epoxy group-functionalized monomers.

3. The method of claim 1, wherein the random copolymer chains comprise from about 10% to about 35% of the of the epoxy group-functionalized monomers.

4. The method of claim 1, wherein the random copolymer chains consist of styrene monomers copolymerized with epoxy group-functionalized monomers.

5. The method of claim 1, wherein the epoxy group-functionalized monomers are glycidyl methacrylate monomers.

6. The method of claim 1, wherein the epoxy group-functionalized monomers are styrenic monomers.

7. The method of claim 5, wherein the block copolymer is a styrene-methyl methacrylate diblock copolymer and the random copolymer chains have a glycidyl methacrylate content in the range from 10% to about 35%.

8. The method of claim 7, wherein the block copolymer is a cylinder-forming diblock copolymer.

9. The method of claim 7, wherein the block copolymer is a lamellae-forming diblock copolymer.

10. The method of claim 1, wherein the block copolymer is a styrene-methyl methacrylate diblock copolymer.

11. The method of claim 1, wherein the block copolymer is a styrene-vinyl pyridine diblock copolymer.

12. The method of claim 1, wherein the block copolymer is a styrene-D,L-lactide diblock copolymer.

13. The method of claim 1, further comprising selectively removing one or more of the block copolymer domains, such that a mask pattern is formed over the substrate.

14. The method of claim 13, further comprising transferring the mask pattern to the substrate.

15. The method of claim 14, wherein the substrate is graphene.

16. A method of forming a self-assembled block copolymer film, the method comprising:
    forming a crosslinked copolymer film on a substrate surface, the crosslinked copolymer film comprising crosslinked random copolymer chains, wherein the random copolymer chains comprise methyl methacrylate monomers copolymerized with crosslinkable epoxy group-functionalized monomers and, optionally, one or more additional monomers; the random copolymer chains comprising at least 4 mol. % of the epoxy group-functionalized monomers and no greater than 5 mol. % of the additional monomers;
    depositing a block copolymer over the crosslinked copolymer film, wherein the block copolymer comprises copolymerized styrene monomers and vinylpyridine monomers and further wherein the crosslinked copolymer film provides a surface-modifying layer for the self-assembly of the block copolymer into patterned domains; and
    subjecting the block copolymer to conditions that induce the block copolymer to self-assemble into patterned domains.

17. The method of claim 16, wherein the random copolymer chains consist of methyl methacrylate monomers copolymerized with epoxy group-functionalized monomers.

18. The method of claim 16, further comprising selectively removing one or more of the block copolymer domains, such that a mask pattern is formed over the substrate.

19. The method of claim 18, further comprising transferring the mask pattern to the substrate.

20. The method of claim 16, wherein the epoxy group-functionalized monomers are glycidyl methacrylate monomers.

21. The method of claim 16, wherein the epoxy groups are not part of an epoxy group-containing cycloaliphatic group and the block copolymer is a diblock copolymer of the styrene monomers and the vinylpyridine monomers.

* * * * *